US 6,731,477 B2

(12) United States Patent
Lin et al.

(10) Patent No.: US 6,731,477 B2
(45) Date of Patent: May 4, 2004

(54) CURRENT-PERPENDICULAR-TO-PLANE SPIN-VALVE SENSOR WITH METALLIC OXIDE BARRIER LAYER AND METHOD OF FABRICATION

(75) Inventors: Tsann Lin, Saratoga, CA (US); Daniele Mauri, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 187 days.

(21) Appl. No.: 09/957,252

(22) Filed: Sep. 20, 2001

(65) Prior Publication Data

US 2003/0053268 A1 Mar. 20, 2003

(51) Int. Cl.[7] .................................................. G11B 5/39
(52) U.S. Cl. .................................................... 360/324.1
(58) Field of Search ......................... 360/324.1, 324.11, 360/324.12, 324.2; 29/603.14

(56) References Cited

U.S. PATENT DOCUMENTS

| 5,390,061 | A | | 2/1995 | Nakatani et al. ............ 360/113 |
|---|---|---|---|---|
| 5,493,465 | A | | 2/1996 | Kamiguchi et al. ......... 360/113 |
| 5,527,626 | A | | 6/1996 | Gijs et al. ................... 428/611 |
| 5,576,914 | A | | 11/1996 | Rottmayer et al. .......... 360/113 |
| 5,668,688 | A | | 9/1997 | Dykes et al. ................ 360/113 |
| 5,774,394 | A | | 6/1998 | Chen et al. .................. 365/158 |
| 5,862,022 | A | | 1/1999 | Noguchi et al. ............ 360/113 |
| 5,886,523 | A | | 3/1999 | Gibbs et al. ................. 324/252 |
| 5,898,547 | A | | 4/1999 | Fontana, Jr. et al. ........ 360/113 |
| 5,966,275 | A | | 10/1999 | Iijima ......................... 360/113 |
| 5,986,858 | A | | 11/1999 | Sato et al. ................... 360/113 |
| 6,600,638 | B2 | * | 7/2003 | Gill ......................... 360/324.11 |
| 2002/0048128 | A1 | * | 4/2002 | Kamiguchi et al. ....... 360/324.1 |
| 2002/0181172 | A1 | * | 12/2002 | Pinarbasi ................. 360/324.12 |
| 2003/0026049 | A1 | * | 2/2003 | Gill ......................... 360/324.12 |
| 2003/0030944 | A1 | * | 2/2003 | Lin et al. ................. 360/324.1 |
| 2003/0031894 | A1 | * | 2/2003 | Lin et al. ..................... 428/693 |
| 2003/0053270 | A1 | * | 3/2003 | Gill ......................... 360/324.11 |

FOREIGN PATENT DOCUMENTS

| JP | 11175921 | 2/1999 | .......... G11B/5/39 |
|---|---|---|---|
| JP | 11224961 | 8/1999 | .......... H01L/43/08 |
| WO | WO9510123 | 9/1994 | |

OTHER PUBLICATIONS

IBM Technical Disclosure Bulletin, vol. 39, Issue 10, pp. 135–140; "New Devices Using Mixed (Ion and Electron) Conductors"; Oct. 1, 2001.*

J.C. Slonczewski, Magnetic Bubble Tunnel Detector, IBM Technical Disclosure Bulletin, vol. 19, No. 6, Nov. 1976 pp. 2328–2332.

Spin Valve Head with Series Connected Current–Perpendicular–to–Plane Type Elements, IBM Technical Disclosure Bulletin, vol. 40 No. 4 Apr. 1997 p. 197.

(List continued on next page.)

Primary Examiner—Jefferson Evans
(74) Attorney, Agent, or Firm—Kunzler & Associates

(57) ABSTRACT

Disclosed is a system and method for forming a current-perpendicular-to-plane (CPP) spin-valve sensor with one or more metallic oxide barrier layers in order to provide a low junction resistance and a high GMR coefficient. In disclosed embodiments, the metallic oxide barrier layers are formed with oxygen-doping/in-situ oxidation processes comprising depositing a metallic film in a first mixture of argon and oxygen gases and subsequent in-situ oxidization in a second mixture of argon and oxygen gases. The exposure to oxygen mixture may be conducted at a low partial oxygen pressure and at a moderate temperature. Smaller, more sensitive CPP spin-valve sensors may be formed through the use of the oxygen-doping/in-situ oxidization processes of the present invention, thus allowing for greater densities of disk drive systems.

20 Claims, 11 Drawing Sheets

OTHER PUBLICATIONS

Spin Valve Read Head with Fe/A1203/Fe/NiFe Tunneling Junction, IBM Technical Disclosure Bulletin, vol. 40 No. 4 1997 pp. 97–98.

H.Sakakima, M Satomi, Y. Sugita, Y. Kawawake, Enhancement of MR ratios using thin oxide layers in PtMn and a–$Fe_2O_3$–based spin valves, Journal of Magnetism and Magnetic Materials 210 (2000) L20–L24.

New Spacer for GMR sensor Research Disclosure, Apr. 2000.

Oxygen as a surfactant in the growth of giant magnetoresistance spin valves, J. Appl. Phys. vol. 82 No. 12 Dec. 15, 1997.

Christian Tolkes, Rainer Struch, and Rudolf David, Surfactant–Induced Layer–by–Layer Growth on a Highly Anistropic Substrate: American Physical Society, vol. 80 No. 13 Mar. 30, 1998.

* cited by examiner

CURRENT-PERPENDICULAR-TO-PLANE SPIN-VALVE SENSOR WITH METALLIC OXIDE BARRIER LAYER AND METHOD OF FABRICATION

BACKGROUND OF THE INVENTION

1. The Field of the Invention

The present invention relates generally to spin-valve sensors for reading data from a magnetic media and, more particularly to novel structures and processes of spin-valve sensors, and to magnetic recording systems which incorporate such spin-valve sensors

2. The Relevant Art

Computer systems generally utilize auxiliary memory storage devices having magnetic media on which data can be written and from which data can be read for later uses. A direct access storage device, such as a disk drive, incorporating rotating magnetic disks, is commonly used for storing data in a magnetic form on the disk surfaces. Data are written on concentric, radially spaced tracks on the disk surfaces. Magnetic read/write heads are then used to read data from the tracks on the disk surfaces.

FIG. 1 shows one example of a disk drive 100 embodying the present invention. As shown in FIG. 1, the disk drive 100 comprises at least one rotatable magnetic disk 112 supported on a spindle 114 and rotated by a disk drive motor 118. The magnetic medium on each magnetic disk 112 is in the form of concentric, annular data tracks (not shown).

At least one slider 113 is positioned on the disk 112. Each slider 113 supports one or more magnetic read/write heads 121 incorporating one or more read sensors of the present invention. As the magnetic disk rotates, the slider 113 is moved radially in and out over the disk surface 122 so that the magnetic read/write heads 121 may access different portions of the magnetic disk 112 where desired data are written. Each slider 113 is attached to an actuator arm 119 by means of a suspension 115. The suspension 115 provides a slight spring force which biases the slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, and the direction and speed of the coil movements are controlled by the motor current signals supplied by a controller 129.

During operation of the disk storage system, the rotation of the magnetic disk 112 generates an air bearing between the surface of the slider 113 (which includes the surface of the head 121) referred to as an air bearing surface (ABS), and the surface 122 of the disk 112. This air bearing exerts an upward force or lift on the slider 113, and thus counterbalances the slight spring force of the suspension 115 and supports the slider 113 off and slightly above the disk surface by a small, substantially constant spacing during normal operation.

The various components of the disk storage system are controlled in operation by control signals generated by the control unit 129. The control signals include access control signals and internal clock signals. Typically, the control unit 129 comprises logic control circuits, storage means, and a microprocessor. The control unit 129 generates control signals to control various system operations such as drive motor control signals on a line 123 and head position and seek control signals on a line 128. The control signals on the line 128 provide the desired current profiles to optimally move and position the slider 113 to the desired data track on the disk 112. Read and write signals are communicated to and from the read/write heads 121 by means of a recording channel 125. In the depicted embodiment, the read/write heads 121 incorporate the read sensor of the present invention.

Two types of read sensors have been extensively explored for magnetic recording at ultrahigh densities ($\geq 20$ Gb/in$^2$). One is a current-in-plane (CIP) spin-valve sensor 200 in which a sense current 218 flows in a direction parallel to interfaces of a plurality of films, as depicted in FIG. 2. The other is a current-perpendicular-to-plane (CPP) magnetic-tunnel-junction sensor 300 in which a sense current 318 flows in a direction perpendicular to the interfaces of a plurality of films. Greater details will be given to the CPP read sensor of the present invention below with reference to FIG. 3.

In high capacity disk drives, a giant magnetoresistance (GMR) head carrying the CIP spin-valve sensor is now extensively used to read written data from the tracks on the disk surfaces. This CIP spin-valve sensor typically comprises two ferromagnetic films separated by an electrically conducting nonmagnetic film. Due to a GMR effect, the resistance of this CIP spin-valve sensor varies as a function of the spin-dependent transmission of conduction electrons between the two ferromagnetic films and the accompanying spin-dependent scattering which takes place at interfaces of the ferromagnetic and nonmagnetic films.

In this CIP spin-valve sensor, one of the ferromagnetic films, referred to as a transverse pinned layer, typically has its magnetization pinned by exchange coupling with an antiferromagnetic film (e.g., Ni—Mn, Pt—Mn, Ir—Mn, etc.) used as a transverse pinning layer. The magnetization of the other ferromagnetic film, referred to as a sense or "free" layer, however, is not fixed and is free to rotate in response to the signal field from written data on the magnetic medium. In this CIP spin-valve sensor, the GMR effect varies as the cosine of the angle between the magnetizations of the sense and transverse pinned layers. The written data can be read from the magnetic medium because the external magnetic field from the written data causes a change in the direction of magnetization in of the sense layer, which in turn causes a change in the resistance of the CIP spin-valve sensor and a corresponding change in the sensed current or voltage. It should be noted that an anisotropy magnetoresistance (AMR) effect is also present in the sense layer and tends to reduce the overall GMR effect.

The CIP spin-valve sensor 200 is formed with deposition methods, such as DC magnetron sputtering, ion beam sputtering, etc, onto a wafer and is confined in a central region with two end regions (not shown) that abut the edges of the central region. Seed layers 202 are deposited on the wafer. These seed layers have a face-centered-cubic crystalline structure, which orients the crystalline structures of subsequently deposited films so that the closest packed planes of these films are parallel to the wafer surface. These closest packed planes are believed to play a crucial role in improving GMR properties of the CIP spin-valve sensor 200.

A transverse pinning layer made of an antiferromagnetic film 204 is deposited above the seed layer 202. A keeper layer made of a ferromagnetic film 206 is separated from a reference layer also made of a ferromagnetic film 210 by a ruthenium (Ru) spacer layer 208. The magnetizations of the keeper layer 206 and the reference layer 210 (both of which are used as transverse pinned layers) are fixed through antiferromagnetic/ferromagnetic coupling between the transverse pinning layer 204 and the keeper layer 206, and through ferromagnetic/ferromagnetic coupling across the Ru spacer layer 208. The reference layer 210 is separated by a copper (Cu) spacer layer 212 from a sense layer also made of a ferromagnetic film 214. The cap layer 216 is deposited above the sense layer 214.

The other, more recently explored CPP magnetic-tunnel-junction sensor is shown in FIG. 3. This CPP magnetic-tunnel-junction sensor 300 has a similar sensor structure as that of the CIP spin-valve sensor 200. The primary difference between the two sensors is that the Cu spacer layer used in the CIP spin-valve sensor 200 is replaced by an Al—O barrier layer in the magnetic-tunnel-junction sensor 300.

The disk drive industry has been engaged in an ongoing effort to increase the recording density of the disk drive, and correspondingly to increase the overall signal sensitivity to permit the currently used CIP spin-valve sensor in the disk drive to read smaller changes in magnetic fields. The major property relevant to the signal sensitivity of the CIP spin-valve sensor is its GMR coefficient. A higher GMR coefficient leads to higher signal sensitivity and enables the storage of more data in a unit area on a disk surface. The GMR coefficient of the CIP spin-valve sensor is expressed as $\Delta R_G/R_\|$, where $R_\|$ is a resistance measured when magnetizations of the sense and reference layers are parallel to each other, and $\Delta R_G$ is the maximum giant magnetoresistance measured when magnetizations of the sense and reference layers are antiparallel to each other.

An additional property relevant to the performance of the CIP spin-valve sensor is ferromagnetic/ferromagnetic coupling between the reference and sense layers. This ferromagnetic/ferromagnetic coupling induces a ferromagnetic coupling field ($H_F$), which must be very well controlled for optimal sensor operation.

In order to achieve higher recording densities, the disk drive industry is constantly miniaturizing the CIP spin-valve sensor. Several challenges have arisen due to the miniaturization of the CIP spin-valve sensor. One area of difficulty has been finding an ideal insulating gap material for the use as thin top and bottom gap layers. To attain, for example, a 38.8 nm thick CIP spin-valve sensor with the sense layer located in the center of a 80 nm thick read gap, the top and bottom gap layers must have thicknesses of 34.4 and 6.8 nm, respectively. A 6.8 nm thick bottom gap layer is too thin to prevent electrical shorting between the bottom magnetic shield layer and the CIP spin-valve sensor. Consequently, there is a high possibility of electrical shorting, making the CIP spin-valve sensor non-functional.

The CPP magnetic-tunnel-junction sensor has been used to solve these issues. The CPP magnetic-tunnel-junction sensor is made of at least two ferromagnetic films separated by an insulating barrier layer. The tunnel magnetoresistance (TMR) coefficient is defined as $\Delta R_T/R_\|$, where $R_\|$ is the resistance measured when the magnetizations of the two ferromagnetic films are parallel to each other, and $\Delta R_T$ is the maximum tunnel magnetoresistance measured when the magnetizations of the two ferromagnetic films are antiparallel to each other. Since the sense current must flow from a top magnetic shield layer, through the sensor, to a bottom magnetic shield layer, or vice versa, both top and bottom gap layers must be formed of conducting films. As a result, electrical shorting between the top and bottom magnetic shield layers and the sensor, and between the sensor and the top magnetic shield layer, is no longer a concern, and further decreasing of the read gap thickness to below 60 nm becomes feasible.

Issues are also encountered when attempting to use the CPP magnetic-tunnel-junction sensor to increase magnetic recording densities. These issues originate mainly from difficulties in attaining a high TMR coefficient and a low junction resistance simultaneously. For instance, in a typical oxidation process used for the CPP magnetic-tunnel-junction random access memory, where a 1.2 nm thick Al film is exposed for 1 hour in air, a TMR coefficient of 29.3% and a junction resistance of 5714 $\Omega$-$\mu m^2$ are attained. This junction resistance is much higher than a most preferred junction resistance of 0.4 $\Omega$-$\mu m^2$. With this most preferred junction resistance, a CPP magnetic-tunnel-junction sensor with a width of 0.1 $\mu m$ and a height of 0.1 $\mu m$ will exhibit an optimal sensor resistance of 40 $\Omega$. With the optimal resistance of 40 $\Omega$, high signal amplitudes can be attained without concerns on electrostatic discharge.

To substantially reduce the junction resistance to a value in a preferred range of between 0.1 and 10 $\Omega$-$\mu m^2$, an in-situ oxidation process, where a 0.54 nm thick Al film is exposed for 4 min in an oxygen gas of 2 Torr, is applied. After this in-situ oxidation process, a TMR coefficient of 18.5% and a junction resistance of 8 $\Omega$-$\mu m^2$ are attained. Hence, the TMR coefficient and junction resistance of the CPP magnetic-tunnel-junction sensor substantially depend on the thickness, oxidation pressure, and oxidation time of the Al—O barrier layer. As seen from the above discussion, the state-of-the-art CPP magnetic-tunnel-junction sensor is still not viable for the use for magnetic recording.

The difficulty in attaining a low junction resistance originates from the high electrical resistivity of the Al—O film ($\geq 10^8$ $\mu\Omega$-cm). Hence, to attain a low junction resistance, a barrier layer with a low electrical resistivity must be selected. A CIP spin-valve sensor with a Cu spacer layer may be implemented into the CPP magnetic-tunnel-junction sensor structure, and used as a CPP spin-valve sensor. A GMR effects, instead of the tunneling effects, will occur in the CPP spin-valve sensor. Its GMR coefficient is typically higher by approximately 40% than that of the CIP spin-valve sensor. However, this CPP spin-valve sensor with the Cu barrier layer is also not viable due to a low electrical resistivity of the Cu film (~3 $\mu\Omega$-cm), which will lead to a junction resistance of as low as below 0.001 $\Omega$-$\mu m^2$.

Thus, it can be seen from the above discussion that there is a need existing in the art for an improved CPP spin-valve sensor exhibiting a high GMR coefficient and a low junction resistance simultaneously. Particularly, it would be advantageous to provide a CPP spin-valve sensor exhibiting a junction resistance controlled to be much higher than that of a CPP spin-valve sensor with a Cu barrier layer, but significantly lower than that of a CPP magnetic-tunnel-junction sensor with an Al—O barrier layer.

OBJECTS AND BRIEF SUMMARY OF THE INVENTION

The apparatus of the present invention has been developed in response to the present state of the art, and in particular, in response to the problems and needs in the art that have not yet been fully solved by currently available current-in-plane (CIP) spin-valve sensors. Accordingly, it is an overall object of the present invention to provide a current-perpendicular-to-plane (CPP) spin-valve sensor that overcomes many or all of the above-discussed shortcomings in the art.

To achieve the foregoing object, and in accordance with the invention as embodied and broadly described herein in the preferred embodiments, novel CPP spin-valve sensor is provided. The CPP spin-valve sensor of the present invention in one embodiment comprises a metallic oxide barrier layer interposed between the sense layer and the reference layer. Under a preferred embodiment of the present invention, the metallic oxide barrier layer is formed substantially of a Cu—O film with an oxygen content in the range of between about 12 and about 24 at %, with a thickness in the range of between about 2 and about 6 nm, and with an electrical resistivity in the range of between about 100 and about 1600 $\mu\Omega$-cm. The CPP spin-valve sensor also comprises a reference layer formed of a second ferromagnetic film disposed to one side of the sense layer, a keeper layer disposed to one side of the reference layer, a transverse pinning layer disposed to one side of the keeper layer, and longitudinal pinned and pinning layers disposed to another side of the sense layer.

In an alternative embodiment, the CPP spin-valve sensor comprises a plurality of alternating metallic oxide barrier and sense layers. In one embodiment the plurality of alternating metallic oxide barrier and sense layers comprises 3 metallic oxide barrier and 3 sense layers.

The CPP spin-valve sensor of the present invention may be incorporated within a disk drive system comprising a magnetic disk, a CPP spin-valve sensor configured in the manner discussed above, an actuator for moving the CPP spin-valve sensor across the magnetic disk so that the CPP spin-valve sensor may access different regions of written data on the magnetic disk, and a detector. The detector may be electrically coupled to the CPP spin-valve sensor for detecting changes in resistance of the sensor caused by the rotation of the magnetization of the sense layer relative to the fixed net magnetizations of the reference and keeper layers in response to magnetic fields from the written data.

A method of fabrication of the present invention is also presented for forming a metallic oxide barrier layer of a CPP spin-valve sensor. In one embodiment the fabrication method comprises forming the afore-mentioned layers of the CPP spin-valve sensor, and forming a metallic oxide barrier layer to one side of the reference layer by depositing a metallic film using reactive DC-pulsed sputtering in a first mixture of argon and oxygen gases and subsequent in-situ oxidizing in a second mixture of argon and oxygen gases.

The thickness of the oxygen-doped/in-situ oxidized film is in the range of between about 2 nm and about 6 nm. In one embodiment, the oxygen doping process is conducted preferably in the first mixture of argon and oxygen gases of 2.985 and 0.015 mTorr, respectively. The in-situ oxidation process is conducted preferably in the second mixture of argon and oxygen gases of 2.94 and 0.06 mTorr, respectively.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
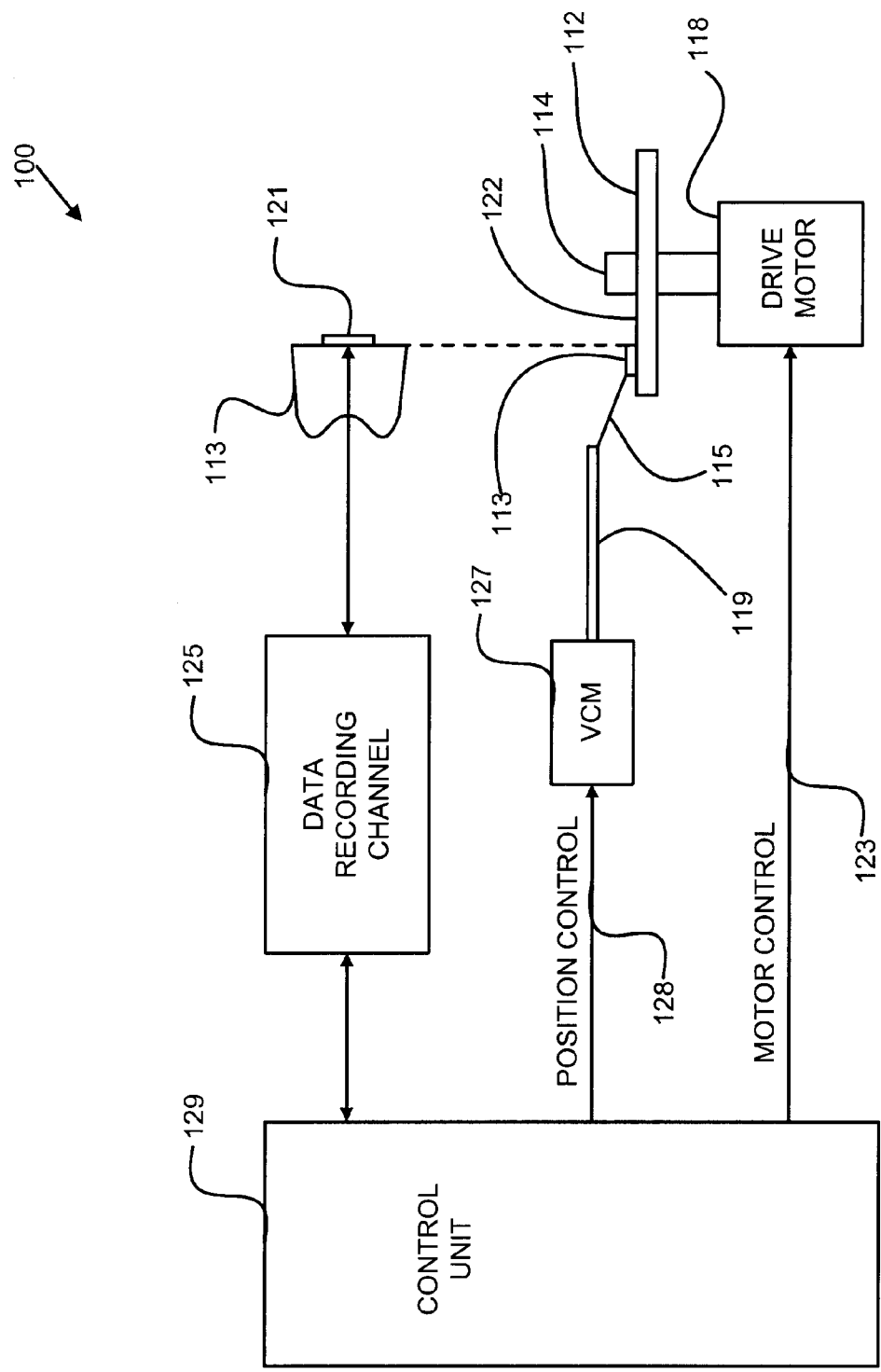
FIG. 1 is a schematic block diagram illustrating one embodiment of a magnetic recording disk drive system.
Figure 2:
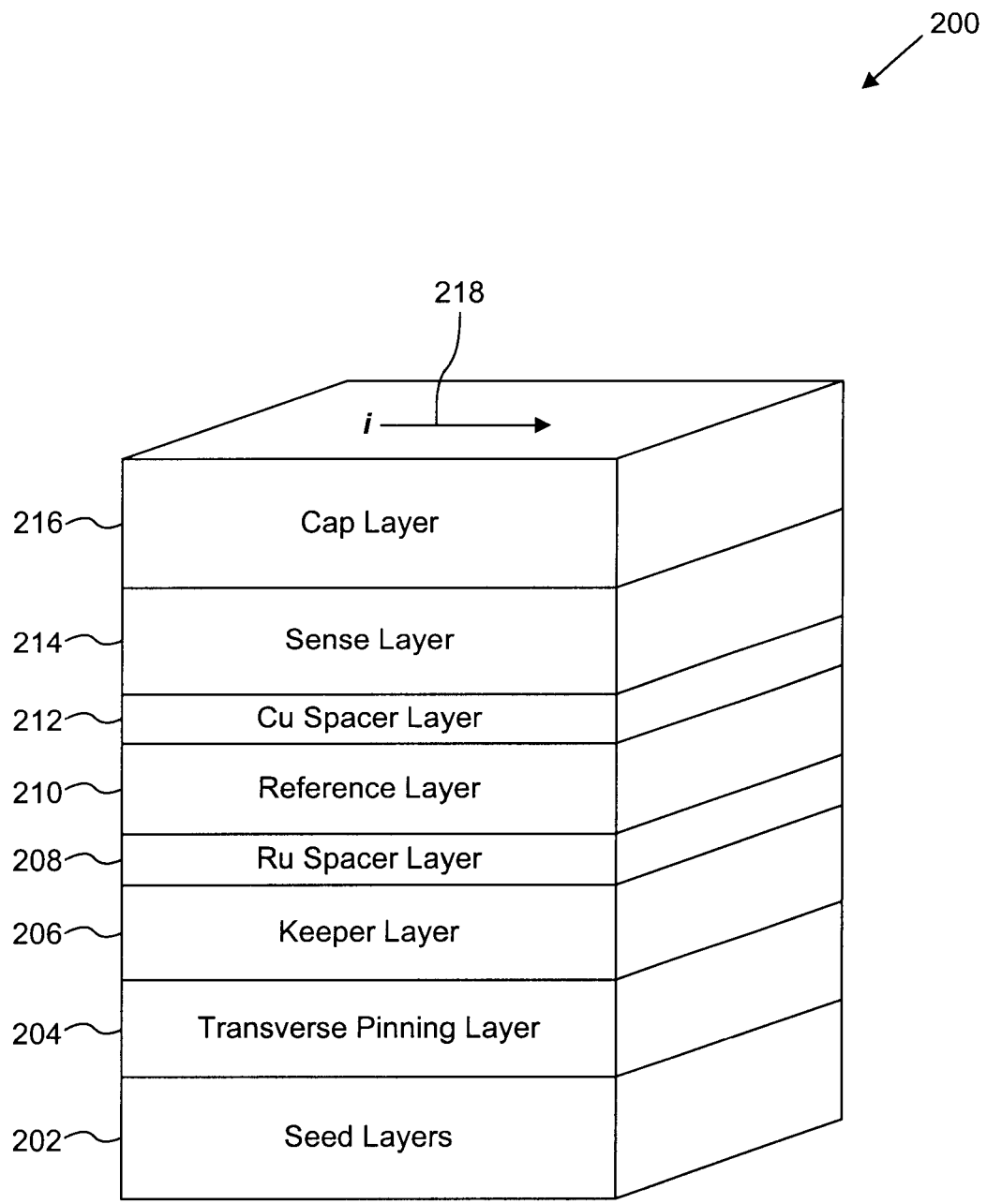
FIG. 2 is a cross-sectional view illustrating the structure of a CIP spin-valve sensor of the prior art.
Figure 3:
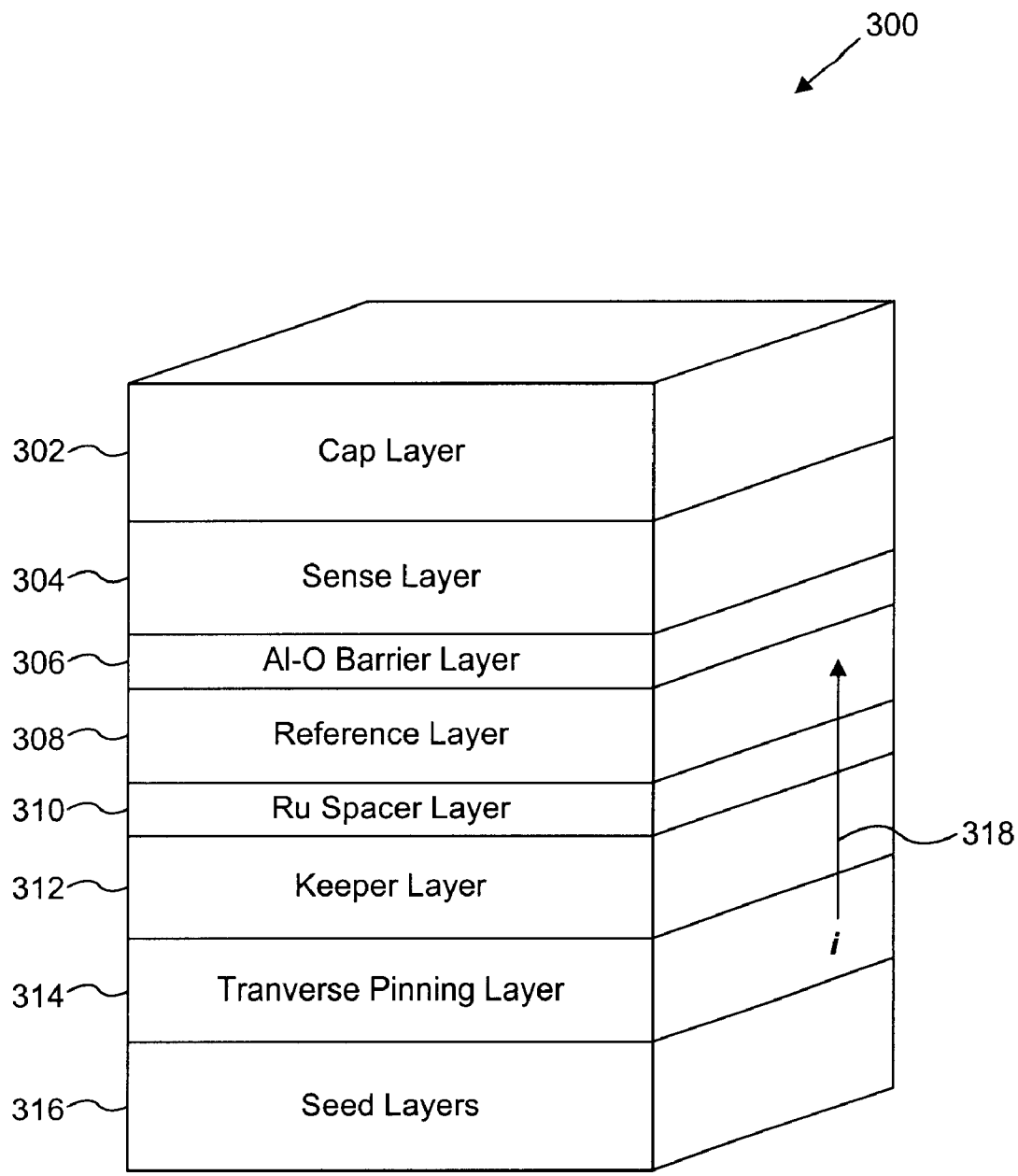
FIG. 3 is a cross-sectional view illustrating the structure of a CPP magnetic-tunnel-junction sensor of the prior art.
Figure 4:
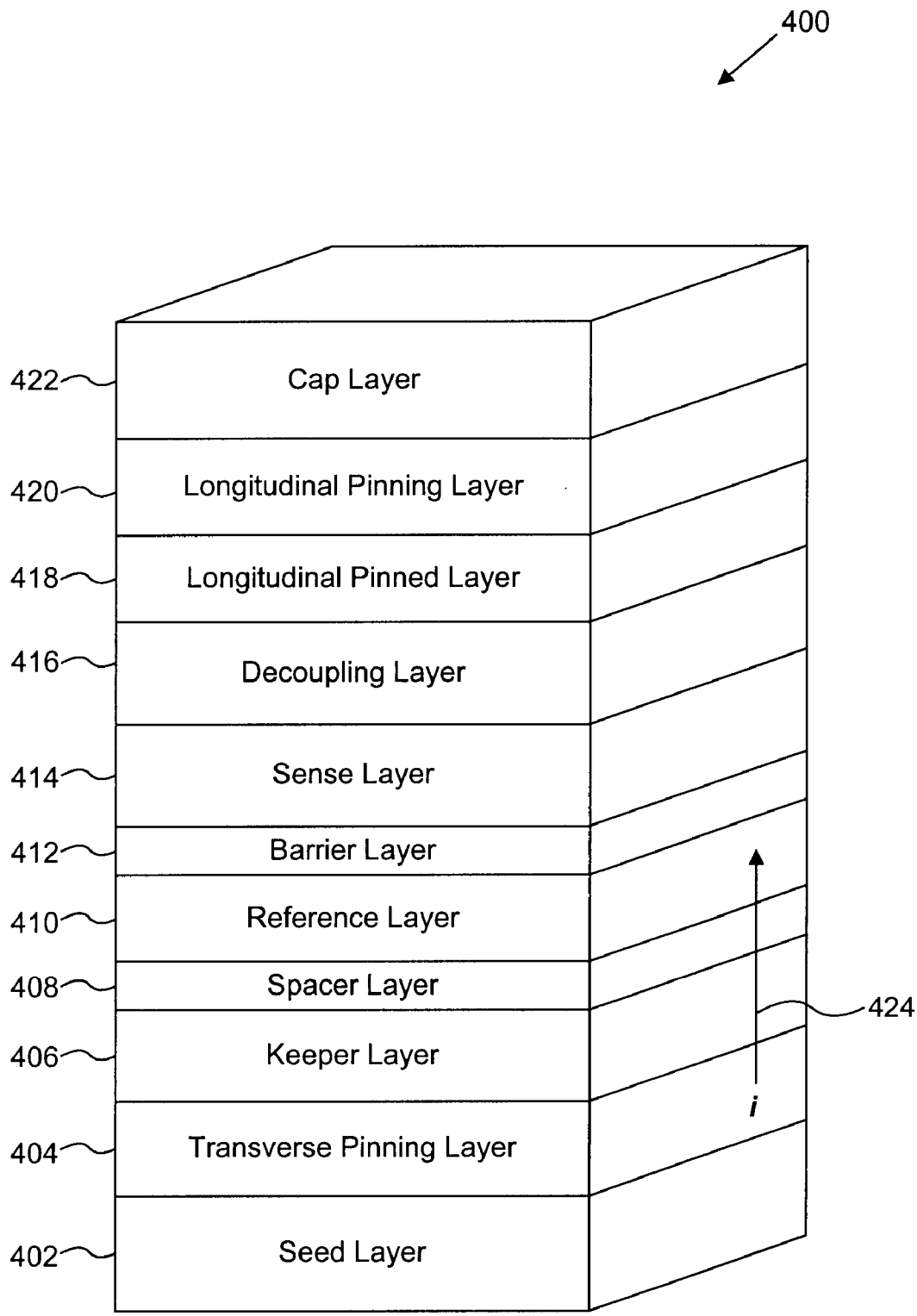
FIG. 4 is a cross-sectional view illustrating the structure of a CPP spin-valve sensor of the present invention.

Referring to FIG. 4, shown therein is one embodiment of a CPP spin-valve sensor 400 of the present invention. The depicted embodiment is a bottom-type current-perpendicular-to-plane (CPP) spin-valve sensor (where the transverse pinning layer is located below the sense layer), but of course, other types of CPP spin-valve sensors may also be formed using the novel metallic oxide barrier layer and processes of the present invention, such as top and dual CPP spin-valve sensors. In the depicted embodiment, the CPP spin-valve sensor 400 is formed by a suitable deposition method such as DC magnetron or ion beam sputtering onto a wafer (not shown).

Under a preferred embodiment of the present invention, a seed layer 402 is formed on a wafer. The seed layer 402 may be configured in a number of different ways according to the invention, and functions primarily to form a foundation for the growth of the layers on top of it. In one embodiment, the seed layer 402 comprises a Ni—Cr—Fe film and a Ni—Fe film. The seed layer 402 preferably has a thickness ranging from about 2 nm to about 5 nm and a more preferred thickness of about 4 nm. In this embodiment, the Ni—Cr—Fe film may have a thickness of about 3 nm, and the Ni—Fe film may have a thickness of about 1 nm.

In the following description, "above" is intended to refer to a direction further away from the seed layer 402 and "below" is intended to refer to a direction closer to the seed layer 402. Likewise, "bottom" layers are those closest to the seed layer 402, and the "top" layers are those furthest from the seed layer 402. Above the seed layer 402 are shown a transverse pinning layer 404, a keeper layer 406, a spacer layer 408, a reference layer 410, a barrier layer 412, a sense layer 414, a decoupling layer 416, a longitudinal pinned layer 418, a longitudinal pinning layer 420, and a cap layer 422.

The transverse pinning layer 404 is deposited above the seed layer 402. The transverse pinning layer 404 is preferably formed of a Pt—Mn film with a Mn content preferably in the range of between about 47 and about 53 at %, and a most preferred Mn content of about 50 at %. The transverse pinning layer 404 has a thickness preferably in the range of between about 15 and about 25 nm, and a most preferred thickness of about 20 nm. The composition and thickness of the Pt—Mn film are optimally selected in order for the Pt—Mn film to become antiferromagnetic and strongly exchange-couple with an adjacent ferromagnetic film after appropriate annealing.

A keeper layer 406 is deposited above the transverse pinning layer 404. The keeper layer 406 is preferably formed of a Co—Fe film with an Fe content preferably in the range of between about 50 and about 0 at %, and a most preferred Fe content of about 10 at %. The Co—Fe film has a thickness preferably in the range of between about 1.6 nm and about 2.4 nm, and a most preferred thickness of about 2 nm. A spacer layer 408 is deposited above the keeper layer 406. The spacer layer 408 is preferably formed of a Ru film with a thickness preferably in the range of between about 0.6 nm and about 1 nm, and a most preferred thickness of about 0.8 nm. The thickness of the Ru film must be very well selected in order to induce very strong antiparallel exchange-coupling between the keeper layer 406 and the reference layer 410.

The reference layer 410 is deposited above the spacer layer 408. The reference layer 410 is preferably formed of a Co—Fe film with an Fe content preferably in the range of between about 50 and about 0 at %, and a most preferred Fe content of about 10 at %. The Co—Fe film has a thickness preferably in the range of between about 1.8 nm and about 2.6 nm, and a most preferred thickness of about 2.2 nm. The thickness of the reference layer 410 is slightly higher than that of the keeper layer 406, in order to attain designed small net magnetic moments of the reference and keeper layers, which induce desired small demagnetizing fields after sensor lapping.

A metallic oxide barrier layer 412 is shown deposited over and adjacent to the reference layer 410. In order to provide the advantages of the present invention, the barrier layer 412 is preferably formed of a metallic oxide film that has an optimal electrical resistivity much higher than that (~3 $\mu\Omega$-cm) of the Cu spacer layer used in the CIP spin-valve sensor, but much lower than that ($\geq 10^8$ $\mu\Omega$-cm) of the Al—O barrier layer used in the CPP magnetic-tunnel-junction sensor. In one embodiment, the barrier layer 412 is formed of an oxygen-doped/in-situ oxidized Cu (Cu—O) film with an oxygen content preferably in the range of between about 12 and about 24 at %, and a most preferred oxygen content of about 20 at %. This composition range is selected since a transformation from a Cu face-centered-cubic phase to a Cu—O amorphous phase occurs at the oxygen content of about 12 at %, and another transformation from the Cu—O amorphous phase to a $CuO_2$ face-centered-cubic phase occurs at the oxygen content of about 24 at %. In this composition range, the Cu—O film is thus amorphous, and this amorphous phase exhibits an optimal electrical resistivity in the range of between about 100 and about 1600 $\mu\Omega$-cm.

The Cu—O film 412 has a thickness preferably in the range of about 2 nm and about 6 nm, and a most preferred thickness of about 2.2 nm. The thickness and the oxygen-doping/in-situ oxidation processes are carefully selected in order to attain a slightly positive ferromagnetic coupling field ($\leq 20$ Oe) between the reference and sense layers for balancing the demagnetizing fields (induced from the net magnetic moments of the reference and keeper layers after sensor lapping), thereby orienting the magnetization of the sense layer 414 in a longitudinal direction parallel to an air bearing surface for optimal sensor operation. The oxygen-doping/in-situ oxidation processes will be discussed in greater details below with reference to FIG. 8.

In one embodiment, a sense layer 414 is formed above the barrier layer 412. The sense layer 414 is preferably formed of a Co—Fe film with an Fe content preferably in the range of between about 10 and about 18 at %, and a most preferred Fe content of about 14 at %. The Fe content of the Co—Fe film is optimally selected in order for the sense layer with a designed magnetic moment to exhibit a negative saturation magnetostriction in the range of between $-1 \times 10^{-6}$ and $-2 \times 10^{-6}$. The sense layer 414 has a thickness preferably in the range of between about 0.6 nm and about 3.6 nm, in order to provide a designed magnetic moment in the range of between about 0.08 and about 0.48 memu/cm$^2$, and a most preferred thickness of about 1.8 nm (corresponding to a magnetic moment of about 0.24 memu/cm$^2$).

Preferably, a decoupling layer 416 is formed above the sense layer 414. Under a preferred embodiment of the present invention, the decoupling layer 416 comprises bilayer films of Cu—O and Ru films. The bilayer films are more effective than a single-layer film in diminishing exchange coupling between the sense layer 414 and the longitudinal pinned layer 418. Hence, the decoupling layer can be as thin as possible to ensure strong magnetostatic interaction through a flux closure formed by the sense and longitudinal pinned layers, thereby achieving good sensor stability. The Cu—O film is used as a lower portion of the decoupling layer in order to protect the underlying sense layer, thereby facilitating it to exhibit anisotropic and good soft magnetic properties.

For example, when a 1.8 nm thick 86Co-14Fe film (composition in atomic percent) is sandwiched between two Cu—O films, its easy- and hard-axis coercivities can reach as low as below 6 and 0.2 Oe, respectively. The Cu—O film has a thickness preferably in the range of between about 0.5 and about 1.5 nm, with a most preferred thickness of about 1 nm. The Ru film is used as an upper portion of the decoupling layer in order to facilitate the overlying longitudinal pinned and pinning layers to exhibit a high pinning field. The Ru film has a thickness preferably in the range of between about 1 and about 3 nm, with a most preferred thickness of about 2 nm.

A longitudinal pinned layer 418 is formed above the decoupling layer 416. The longitudinal pinned layer 418 is preferably formed of a Co—Fe film with an Fe content preferably in the range of between about 10 and about 18 at %, and a most preferred Fe content of about 14 at %. The longitudinal pinned layer 418 has a thickness preferably in the range of between about 0.9 and about 5.4 nm (to provide a designed magnetic moment in the range of between about 0.12 and about 0.72 memu/cm$^2$), with a most preferred thickness of about 2.7 nm (corresponding to a magnetic moment of about 0.36 memu/cm$^2$). The magnetic moment of the longitudinal pinned layer 418 is preferably 1.5 times of that of the sense layer in order to achieve sensor stability.

A longitudinal pinning layer 420 is formed above the longitudinal pinned layer 418. The longitudinal pinning layer 420 is preferably formed of an Ir—Mn film with a Mn content preferably in the range of between about 75 and about 85 at %, and a most preferred Mn content of about 80 at %. The longitudinal pinning layer 420 has a thickness preferably in the range of between about 4.5 and about 9 nm, with a most preferred thickness of about 6 nm.

A cap layer 422 is formed above the longitudinal pinning layer 420. The cap layer 422 is preferably formed of a Ru film with a thickness preferably in the range of between about 3 and about 9 nm, and a most preferred thickness of about 6 nm.

Figure 5:
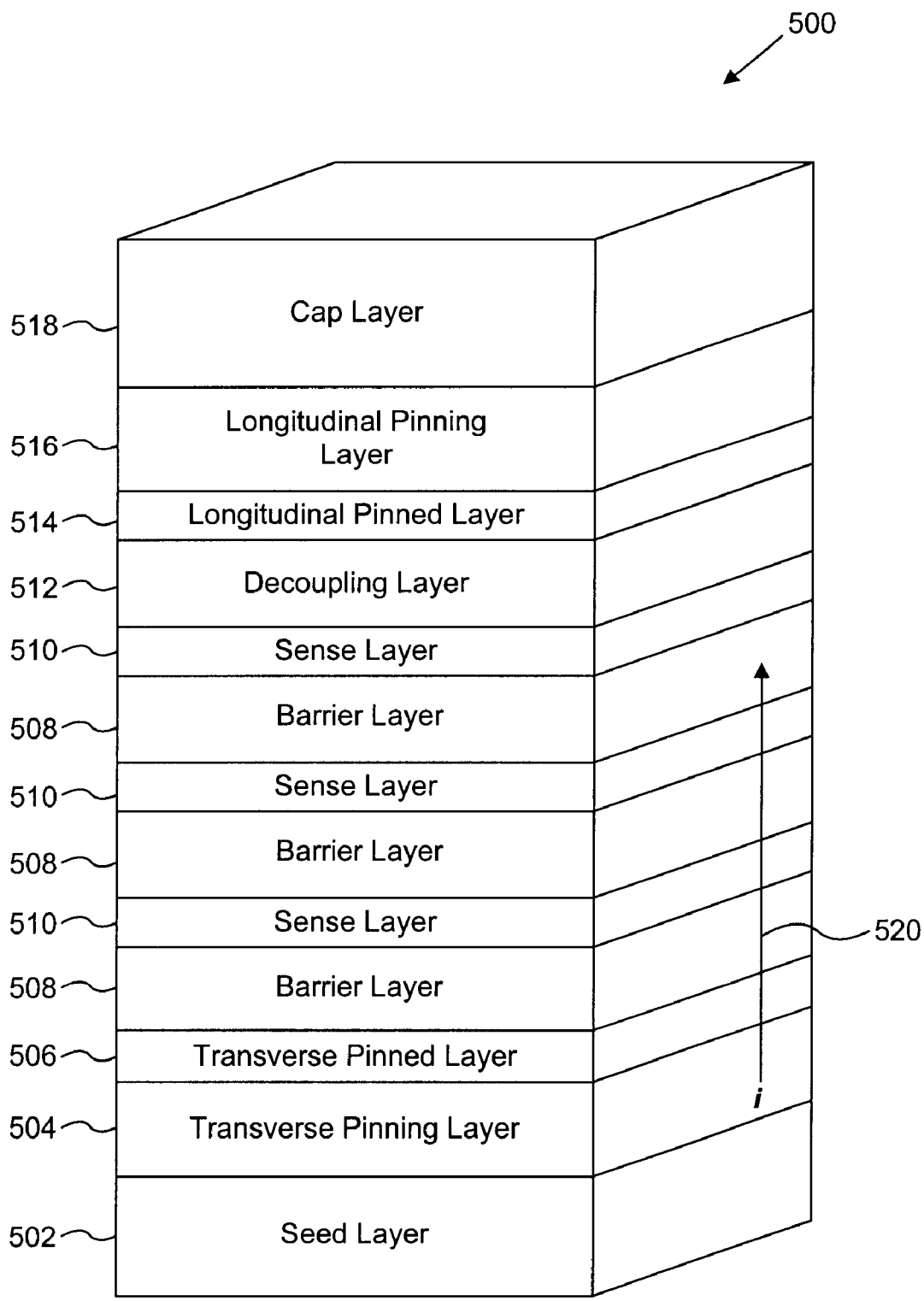
FIG. 5 is a cross-sectional view illustrating the structure of an alternative embodiment of a CPP spin-valve sensor of the present invention.

Referring now to FIG. 5, shown therein is a schematic block diagram illustrating an alternative embodiment of the present invention. A CPP spin-valve sensor with multiple barrier and sense layers 500 preferably comprises a seed layer 502, a transverse pinning layer 504, a transverse pinned layer 506, a plurality of barrier layers 508, a plurality of sense layers 510, a decoupling layer 512, a longitudinal pinned layer 514, a longitudinal pinning layer 516, and a cap layer 518.

The compositions and thicknesses of the seed layer 502, the transverse pinning layer 504, the decoupling layer 512, the longitudinal pinning layer 516, and the cap layer 518 are substantially the same as those of the corresponding seed layer 402, transverse pinning layer 404, decoupling layer 416, longitudinal pinning layer 420, and cap layer 422 of FIG. 4. The compositions of the transverse pinned layer 506, the sense layers 510, and the longitudinal pinned layer 514 are substantially the same as those of the corresponding reference layer 410, sense layer 414, and longitudinal pinned layer 418 of FIG. 4.

The composition and thickness ranges of the barrier layers 508 are substantially equivalent to those of the corresponding barrier layer 412 of FIG. 4. However, the preferred composition and thickness of the barrier layers 508 are slightly different from those of the corresponding barrier layer 412 of FIG. 4. The key difference is that the oxygen-doping/in-situ oxidation processes are slightly modified in order to attain a negative ferromagnetic coupling field ($\leq$-5 Oe) between the transverse pinned and lowest sense layer, as well as between any two adjacent sense layers.

The transverse pinned layer 506 and the sense layers 510 have thicknesses preferably in the range of between about 1 and about 1.4 nm, with a most preferred thickness of about 1.2 nm. The thickness of the transverse pinned layer 506 is basically identical to that of either one of the sense layers 510, in order to provide demagnetization fields (induced from the magnetic moment of the transverse pinned layer 506 after sensor lapping) high enough to rotate the magnetization of either one of the sense layers 510 by ~45° from a longitudinal direction parallel to the air bearing surface. The negative ferromagnetic coupling field between the transverse pinned and lowest sense layers, as well as between any two adjacent sense layers, also facilitate this magnetization rotation. Due to antiparallel exchange coupling between the transverse pinned and lowest sense layers, as well as between any two adjacent sense layers, this magnetization rotation causes the magnetizations of any two adjacent sense layers to be oriented in directions perpendicular to each other. This perpendicular orientation relationship is desired for good signal linearity and high signal sensitivity.

The longitudinal pinned layer 514 has a thickness preferably in the range of between about 4.5 and about 6.3 nm, with a most preferred thickness of about 5.4 nm. The thickness of the longitudinal pinned layer 514 is selected in order to exhibit a magnetic moment 1.5 times of the magnetic moments of the plurality of the sense layers 510 in order to achieve sensor stability.

Figure 6:
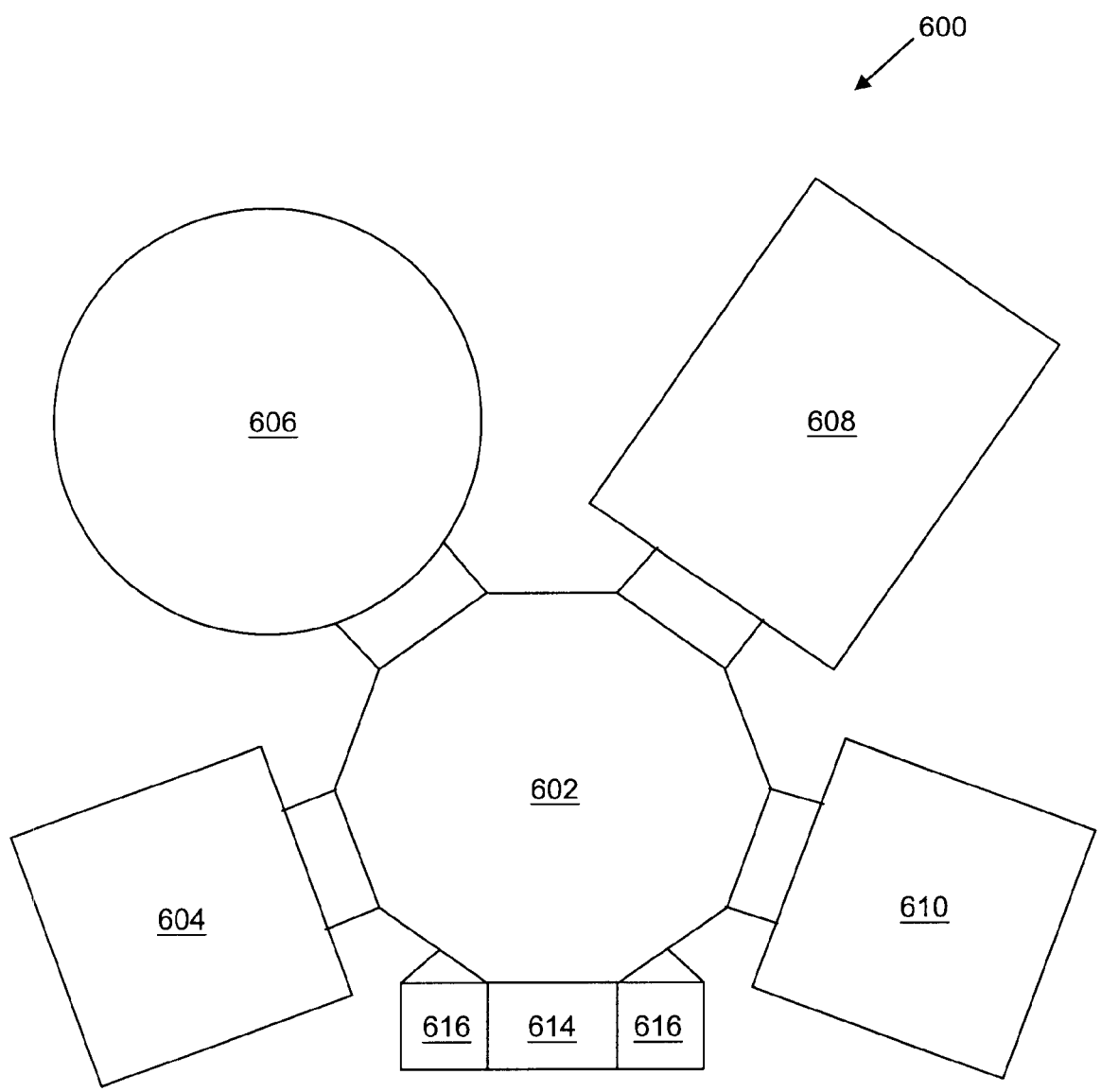
FIG. 6 is a schematic block diagram illustrating one embodiment of an integrated DC magnetron/ion beam sputtering system suitable for use with the present invention.

Referring now to FIG. 6, shown therein is one embodiment of an integrated DC magnetron/ion beam sputtering system 600 suitable for fabricating a CPP spin-valve sensor and for conducting the oxygen doping/in-situ oxidation processes of the present invention. The sputtering system 600 of FIG. 6 is sold by the Veeco Corporation of Plainview, N.Y. The sputtering system 600 as depicted comprises a transport module 602 surrounded by a first single-target DC magnetron sputtering module 604, a multi-target DC magnetron sputtering module 606, a multi-target ion beam sputtering module 608, and a second single-target DC magnetron sputtering module 610. Loadlocks 616 allow the ingress and egress of wafers.

A control panel 614 controls the parameters and processes of the sputtering system 600. The depositions of the seed and transverse pinned layers are preferably conducted in the multi-target ion beam sputtering module 608 in order to provide a flat surface, thereby attaining a reasonably low ferromagnetic coupling field. The depositions of all the other layers and the oxygen-doping/in-situ oxidation processes are preferably conducted in the DC magnetron sputtering modules 604, 606, 610, in order to prevent interface mixing, thereby attaining a high GMR coefficient.

Figure 7:
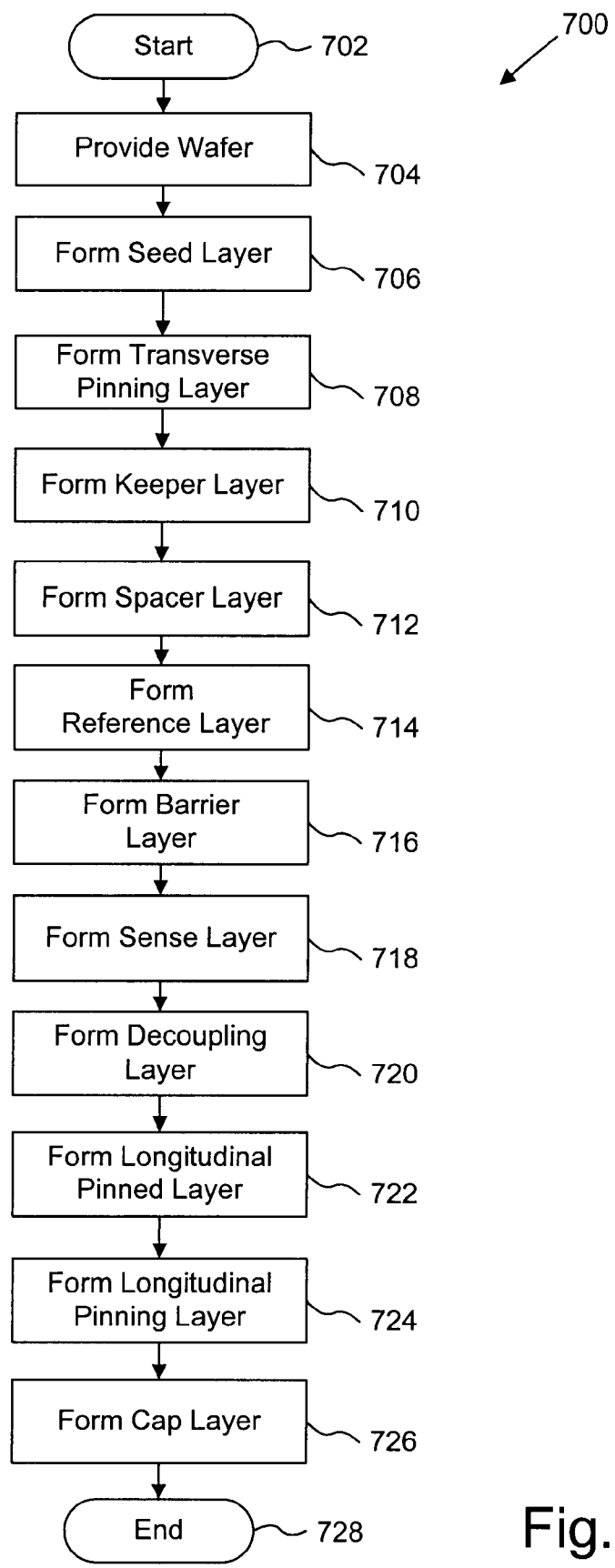
FIG. 7 is a schematic flow chart illustrating a method of fabrication of a CPP spin-valve sensor of the present invention.

FIG. 7 illustrates one embodiment of a method 700 of fabricating a CPP spin-valve sensor of the present invention. The method 700 starts 702 and a wafer is provided 704. Under a preferred embodiment of the present invention, a seed layer is formed 706 on the wafer and configured in the manner described above with reference to the seed layer 402 of FIG. 4. A transverse pinning layer is formed 708 above the seed layer and configured in the manner described with reference to the transverse pinning layer 404 of FIG. 4. In one embodiment, a keeper layer is formed 710 above the transverse pinning layer and is preferably configured in the manner described with reference to the keeper layer 406 of FIG. 4. A spacer layer is formed 712 above the transverse pinning layer and is preferably configured in the manner described with reference to the spacer layer 408 of FIG. 4.

A reference layer is formed 714 above the spacer layer and is configured in the manner described with reference to the reference layer 410 of FIG. 4. A barrier layer is formed 716 above the reference layer, the method of which will be described in greater details below with reference to FIG. 8. In one embodiment, a sense layer is formed 718 above the barrier layer and configured in the manner described with reference to the sense layer 414 of FIG. 4. A decoupling layer is formed 720 above the sense layer and configured in the manner described with reference to the decoupling layer 416 of FIG. 4.

A longitudinal pinned layer is formed 722 above the decoupling layer and configured in the manner described with reference to the longitudinal pinned layer 418 of FIG. 4. A longitudinal pinning layer is formed 724 above the longitudinal pinned layer and configured in the manner described with reference to the longitudinal pinning layer 420 of FIG. 4. A cap layer is formed 726 above the longitudinal pinning layer and configured in the manner described with reference to the cap layer 422 of FIG. 4. The fabrication method 700 ends 728.

The major merit of the Cu—O film used as the barrier layer of the CPP spin-valve sensor is a feasibility of attaining an optimal junction resistance, while still maintaining a reasonably low ferromagnetic coupling field and a high GMR coefficient. Two major approaches are used in the formation of this Cu—O film, one oxygen doping during the reactive DC-pulsed magnetron sputtering of a Cu film and the other the in-situ oxidation after the reactive DC-pulsed magnetron sputtering. Both the oxygen doping and in-situ oxidation must be very well optimized in order to ensure the viability of the CPP spin-valve sensor.

Figure 8:
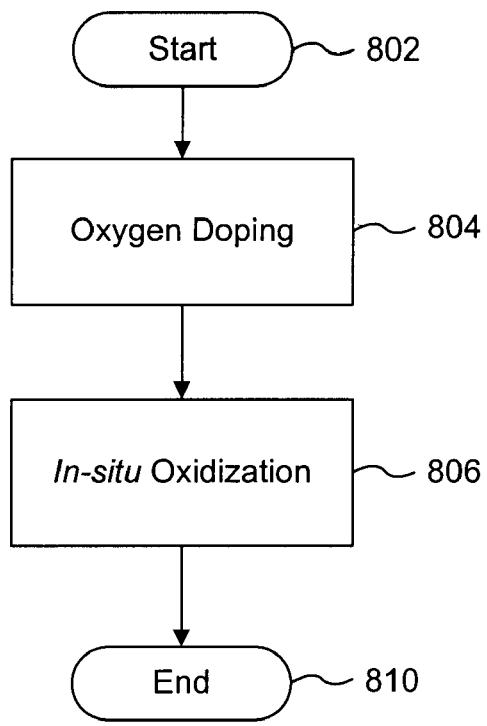
FIG. 8 is a schematic flow chart illustrating a method of fabrication of a metallic oxide barrier layer of the present invention.

Referring now to FIG. 8, the oxygen-doping/in-situ oxidation method starts 802 for the formation of the barrier layer 716. The oxygen doping process is conducted 804 in a first mixture of argon and oxygen gases during the reactive DC-pulsed magnetron sputtering, preferably in the multiple-target DC-magnetron sputtering module 606, such as that described with reference to FIG. 6. Subsequently, the in-situ oxidization process is conducted 806 in a second mixture of argon and oxygen gases immediately after the reactive DC-pulsed magnetron sputtering in the same module, after which the oxygen-doping/in-situ oxidation method ends 808.

Figure 9:
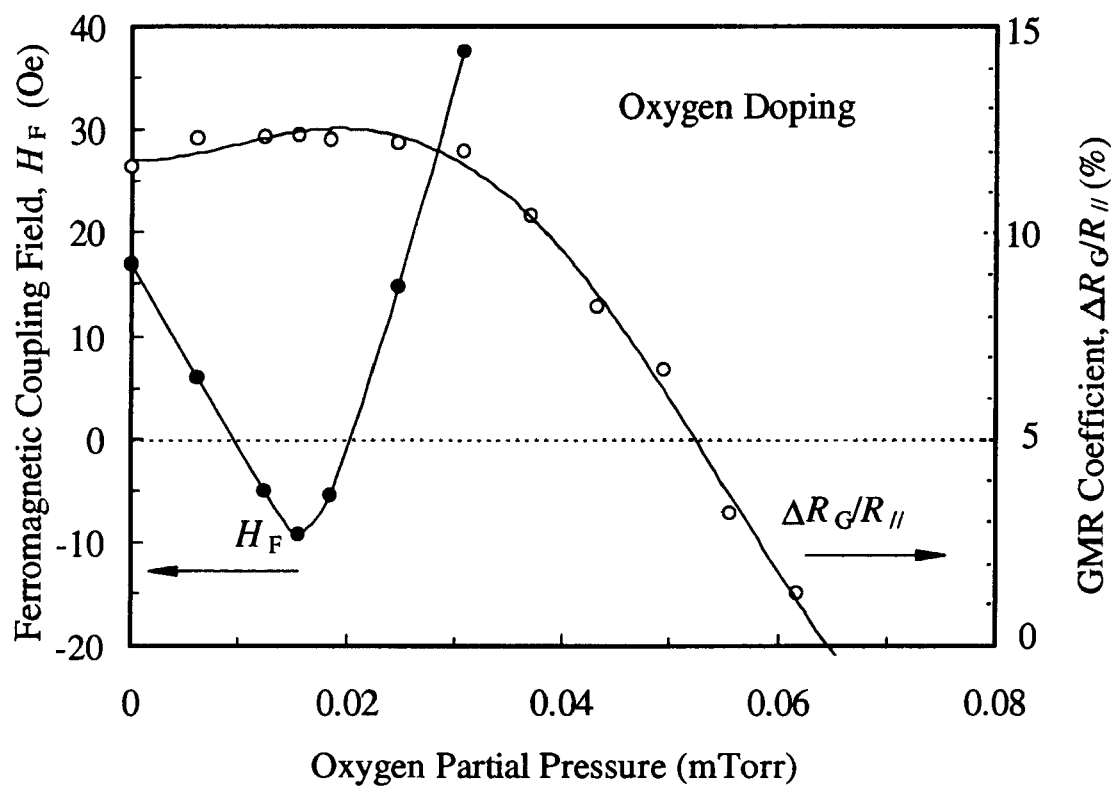
FIG. 9 is a chart depicting the ferromagnetic coupling field and GMR coefficient versus the oxygen partial pressure used in the oxygen-doping process.

The oxygen-doping process is preferably conducted in the first mixture of argon and oxygen gases with a total pressure in the range of between about 2 and about 4 mTorr, and a most preferred total pressure of about 3 mTorr. The oxygen gas has a partial pressure preferably in the range of between about 0.005 and about 0.025 mTorr, and a most preferred partial pressure of 0.015 mTorr. Referring now to FIG. 9, in this preferred partial pressure range, the ferromagnetic coupling field, ranging from −10 to 20 Oe, is reasonably low, while the GMR coefficient, ranging from 12.4% to 13.2%, is very high. It should be noted that these magnetic properties can only be measured from a CIP spin-valve sensor with the same structure. When used as the CPP spin-valve sensor, the ferromagnetic coupling field is expected to be the same, while the GMR coefficient is expected to be higher by 40%.

Figure 10:
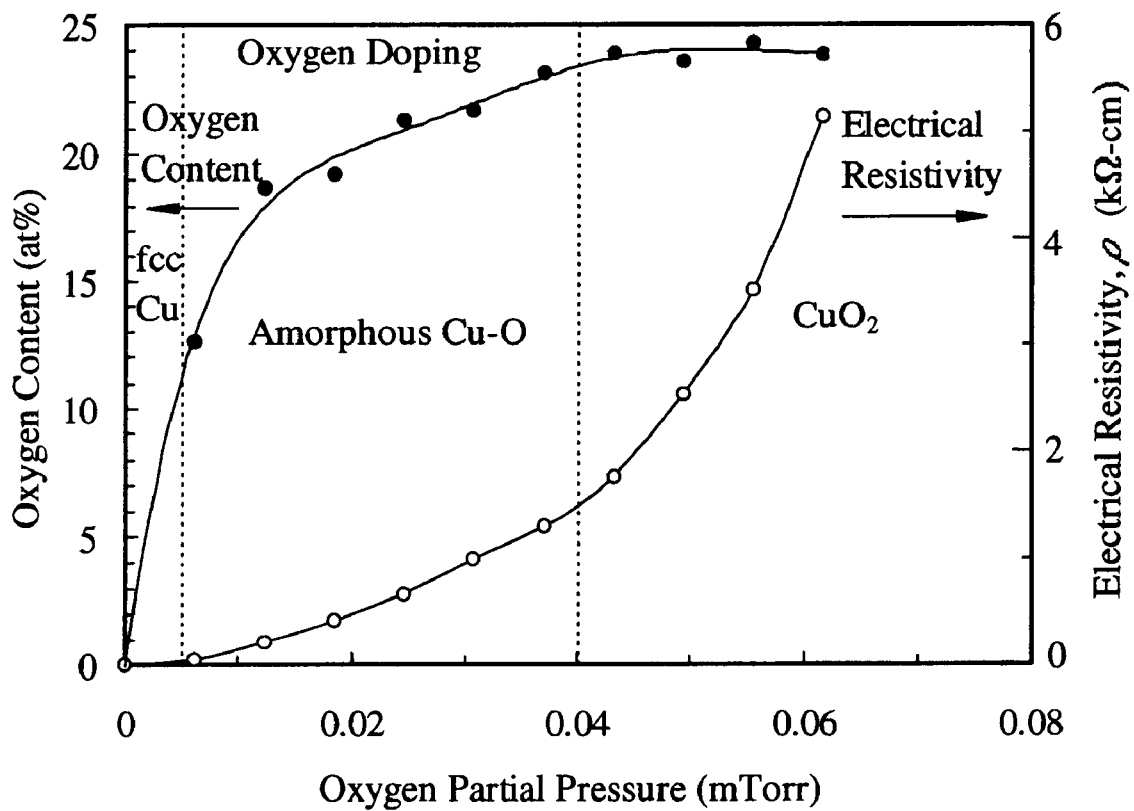
FIG. 10 is a chart depicting the oxygen content and electrical resistivity of an approximately 100 nm thick Cu—O film versus the oxygen partial pressure used in the oxygen-doping process.

In the range of the preferred partial oxygen pressure used in the oxygen-doping process, the Cu—O film appears to exhibit an amorphous phase. Referring to FIG. 10, as the oxygen partial pressure increases from 0 to 0.005 mTorr, a Cu face-centered-cubic phase with an electrical resistivity of 3 $\mu\Omega$-cm is transformed into a Cu—O amorphous phase with an oxygen content of ~12 at % and with an electrical resistivity of 100 $\mu\Omega$-cm. As the oxygen partial pressure further increases to 0.025 mTorr, a Cu—O amorphous phase with an oxygen content of ~24 at % and with an electrical resistivity of 1600 $\mu\Omega$-cm is transformed into a $CuO_2$ face-centered-cubic phase.

Figure 11:
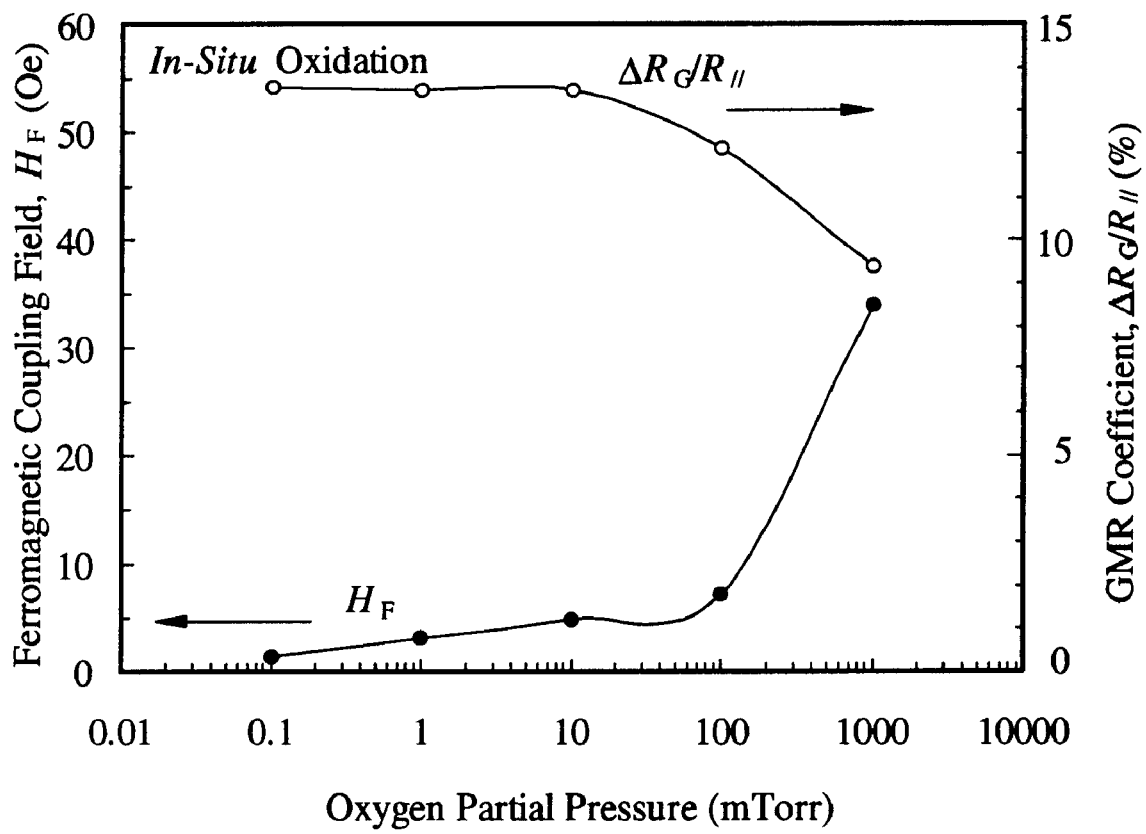
FIG. 11 is a chart depicting the ferromagnetic coupling field and GMR coefficient versus the oxygen partial pressure used in the in-situ oxidation process.

In one embodiment, the in-situ oxidation process is preferably conducted in the second mixture of argon and oxygen gases with a total pressure in the range of between about 1 and about 100 mTorr, with a most preferred total pressure of about 3 mTorr. The oxygen gas has a partial pressure preferably in the range of between about 0.01 and about 10 mTorr, and a most preferred partial pressure of about 0.06 mTorr. Referring to FIG. 11, in this preferred partial pressure range, the ferromagnetic coupling field, ranging from 0 to 10 Oe, is reasonably low, while the GMR coefficient of ~13.2% is very high. It should also be noted that these magnetic properties can only be measured from a CIP spin-valve sensor with the same structure. When used as the CPP spin-valve sensor, the ferromagnetic coupling field is expected to be the same, while the GMR coefficient is expected to be higher by 40%. The total pressure of argon and oxygen gases are preferably maintained for a period in a range of between about 1 and about 120 minutes, and for a preferred period of about 4 minutes. The temperature is preferably maintained at about room temperature (i.e., about 70° F.).

After the depositions of the CPP spin-valve sensor and an additional deposition of 3 nm thick Ta film (used as a protection layer during subsequent annealing processes and as an adhesion layer during patterning processes) on a wafer, the wafer is annealed for 120 minutes at 280° C. in a magnetic field of 10 kOe perpendicular to an alignment mark, and then annealed again in a magnetic field of 200 Oe parallel to the alignment mark for 120 minutes at 240° C. After these two anneals, bilayer photoresists are applied and exposed in a photolithographic tool to mask the CPP spin-valve sensor in a central region, and then developed in a solvent to form an undercut. The CPP spin-valve sensor in two unmasked side regions is removed by ion milling until a Ni—Fe bottom shield layer is exposed, and a 90 nm thick $Al_2O_3$ film is deposited on the exposed Ni—Fe bottom shield layer. Following this $Al_2O_3$ deposition, the bilayer photoresists are lifted off and the additional Ta film is removed by reactive ion etching. A 1 $\mu$m thick Ni—Fe film to be used as a top magnetic shield layer is deposited on the wafer. Bilayer photoresists are applied and exposed in a photolithographic tool to define the shape of the top magnetic shield layer, and then developed in a solvent to form an undercut. The Ni—Fe film in unmasked regions is then removed by selective chemical etching until the $Al_2O_3$ film is exposed.

A CIP spin-valve sensor with a spacer layer formed of an oxygen-doped/in-situ oxidized film, fabricated as described in this invention, has been found to exhibit much better magnetic properties than a conventional CIP spin-valve sensors with a metallic spacer layer. For example, as a Cu spacer layer is replaced by a Cu—O spacer layer, the ferromagnetic coupling fields decreases from 17 to −10 Oe, the GMR coefficient increases from 12.4% to 13.2%. When converting these CIP spin-valve sensor structures into CPP spin-valve sensor structures, the ferromagnetic coupling field is expected to be the same, the GMR coefficient is expected to be higher by 40%, and most importantly, the junction resistance is expected to increase from 0.001 to 0.1 $\Omega$-$\mu m^2$. In order to achieve a higher junction resistance, the partial pressure used for the in-situ oxidation may be as high as 10 mTorr, as shown in the graph of FIG. 11. If the oxygen partial pressure is greater than 10 mTorr, a full in-situ oxidation may lead to an unwanted high ferromagnetic coupling field.

The oxygen-doping/in-situ oxidation processes of the present invention may also be applied to other layers of the CPP spin-valve sensor for further increasing the junction resistance while still maintaining a low ferromagnetic coupling field and a high GMR coefficient.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A current-perpendicular-to-plane (CPP) spin-valve sensor comprising:

a sense layer formed of a first ferromagnetic film;

a reference layer formed of a second ferromagnetic film, the reference layer disposed to one side of the sense layer;

a keeper layer formed of a third ferromagnetic film, the keeper layer disposed to one side of the reference layer;

a transverse pinning layer disposed to one side of the keeper layer;

a spacer layer interposed between the reference layer and the keeper layer; and an oxygen-doped metal barrier layer interposed between the sense layer and the reference layer.

2. The CPP spin-valve sensor of claim 1, wherein the CPP spin-valve sensor comprises a plurality of sense layers and oxygen-doped metal barrier layers.

3. The CPP spin-valve sensor of claim 1, wherein the oxygen-doped metal barrier layer is formed substantially of a Cu—O film with an oxygen content in the range of between about 12 and about 24 at %.

4. The CPP spin-valve sensor of claim 1, wherein the oxygen-doped metal barrier layer has a thickness in the range of between about 2 and about 6 nm.

5. The CPP spin-valve sensor of claim 1, wherein the oxygen-doped metal barrier layer has a preferred thickness of about 2.2 nm.

6. The CPP spin-valve sensor of claim 1, wherein the oxygen-doped metal barrier layer has an electrical resistivity in the range of between about 100 and about 1600 $\mu\Omega$-cm.

7. The CPP spin-valve sensor of claim 1, wherein the oxygen-doped metal barrier layer has a preferred electrical resistivity of about 200 $\mu\Omega$-cm.

8. A current-perpendicular-to-plane (CPP) spin-valve sensor comprising:

a seed layer;

a transverse pinning layer disposed to one side of the seed layer;

a keeper layer disposed to one side of the transverse pinning layer;

a spacer layer disposed to one side of the keeper layer;

a reference layer disposed to one side of the spacer layer;

an oxygen-doped metal barrier layer disposed to one side of the reference layer, the oxygen-doped metal barrier layer formed substantially of a Cu—O film with an oxygen content in the range of between about 12 and about 24 at %, with a thickness in the range of between about 2 and about 6 nm, and an electrical resistivity in the range of between about 100 and about 1600 $\mu\Omega$-cm;

a sense layer disposed to one side of the barrier layer;

a decoupling layer disposed to one side of the sense layer;

a longitudinal pinned layer disposed to one side of the decoupling layer;

a longitudinal pinning layer disposed to one side of the longitudinal pinned layer; an a cap layer disposed to one side of the longitudinal pinning layer.

9. A current-perpendicular-to-plane (CPP) spin-valve sensor comprising:

a seed layer;

a transverse pinning layer disposed to one side of the seed layer;

a transverse pinned layer disposed to one side of the transverse pinning layer;

a plurality of alternating sense and oxygen-doped metal barrier layers;

an oxygen-doped metal barrier layer formed substantially of a Cu—O film with an oxygen content in the range of between about 12 and about 24 at %, with a thickness in the range of between about 2 and about 6 nm, and an electrical resistivity in the range of between about 100 and about 1600 $\mu\Omega$-cm;

a decoupling layer disposed to one side of the uppermost sense layer;

a longitudinal pinned layer disposed to one side of the decoupling layer;

a longitudinal pinning layer disposed to one side of the longitudinal pinned layer; and a cap layer disposed to one side of the longitudinal pinning layer.

10. The CPP spin-valve sensor of claim 9, wherein the plurality of alternating sense and barrier layers comprises 3 sense layers and 3 oxygen-doped metal barrier layers.

11. A disk drive system comprising:

a magnetic disk;

a current-perpendicular-to-plane spin-valve sensor for reading data recorded on the magnetic disk, comprising:

a substrate;

a seed layer;

a transverse pinning layer adjacent to the seed layer;

a keeper layer formed of a ferromagnetic film positioned adjacent to the transverse pinning layer, the magnetization of the keeper layer substantially fixed by the transverse pinning layer;

a spacer layer adjacent to the keeper layer;

a reference layer formed of a ferromagnetic film adjacent to the spacer layer, the magnetization of the reference layer substantially fixed by the keeper layer;

an oxygen-doped metal barrier layer disposed to one side of the reference layer; the oxygen-doped metal barrier layer formed substantially of a Cu—O film with an oxygen content in the range of between about 12 and about 24 at %, with a thickness in the range of between about 2 and about 6 nm, and an electrical resistivity in the range of between about 100 and about 1600 $\mu\Omega$-cm;

an actuator for moving the CPP spin-valve sensor across the magnetic disk in order for the CPP spin-valve sensor to access different recorded data on the magnetic disk; and a detector electrically coupled to the CPP spin-valve sensor and configured to detect changes in resistance of the sensor caused by rotation of the magnetizations of the sense layer relative to the fixed magnetization of the reference layer in response to changing magnetic fields induced by the recorded data.

12. A method of fabricating a CPP spin-valve read sensor, the method comprising:

forming a reference layer;

forming a keeper layer;

forming a sense layer; and forming an oxygen-doped metal barrier layer to one side of the sense layer with oxygen-doping/in-situ oxidation processes; the oxygen-doping/in-situ oxidation processes comprising depositing a metallic film in a first mixture of argon and oxygen gases and subsequently submitting the metallic film to in-situ oxidation in a second mixture of argon and oxygen gases.

13. The method of claim 12, wherein the oxygen-doping/in-situ oxidation processes further comprises using reactive DC-pulsed sputtering in a mixture of argon and oxygen gases.

14. The method of claim 12, wherein the metallic film substantially comprises copper (Cu).

15. The method of claim 12, wherein the oxygen-doping/in-situ oxidation processes further comprises depositing the metallic film with a thickness in the range of between about 2 nm and about 6 nm.

16. The method of claim 12, wherein the oxygen-doping/in-situ oxidation processes further comprises depositing the metallic film with a thickness of preferably 2.2 nm.

17. The method of claim 12, wherein the oxygen-doping process is conducted in the first mixture of argon and oxygen gases with a total pressure in the range of between about 1 and about 5 mTorr, and with an oxygen partial pressure in the range of between about 0.005 and about 0.025 mTorr.

18. The method of claim 12, wherein the oxygen-doping process is conducted in the first mixture of argon and oxygen gases with a preferred total pressure of 3 mTorr, and a preferred oxygen partial pressure of 0.015 mTorr.

19. The method of claim 12, wherein the in-situ oxidation process is conducted in the second mixture of argon and oxygen gases with a total pressure in the range of between about 1 and about 1000 mTorr, and with an oxygen partial pressure in the range of between about 0.01 and about 100 mTorr.

20. The method of claim 12, wherein the in-situ oxidation process is conducted in the second mixture of argon and oxygen gases with a preferred total pressure of 3 mTorr, and a preferred oxygen partial pressure of 0.06 mTorr.

* * * * *

UNITED STATES PATENT AND TRADEMARK OFFICE
CERTIFICATE OF CORRECTION

PATENT NO. : 6,731,477 B2
DATED : May 4, 2004
INVENTOR(S) : Lin et al.

It is certified that error appears in the above-identified patent and that said Letters Patent is hereby corrected as shown below:

Drawings,
Figure 8, "810" should read -- 808 --.

Column 2,
Line 42, "in of the sense" should read -- in the sense --.

Column 4,
Line 67, "novel CPP" should read -- a novel CPP --.

Column 11,
Line 4, "other the" should read -- other, the --.
Line 4, "oxidation after" should read -- oxidation, after --.
Line 19, "808." should read -- 810. --.

Signed and Sealed this

Ninth Day of November, 2004

JON W. DUDAS
*Director of the United States Patent and Trademark Office*